United States Patent
Chen et al.

(10) Patent No.: US 10,748,880 B2
(45) Date of Patent: Aug. 18, 2020

(54) MICRO LED DISPLAY PANEL AND MANUFACTURING METHOD THEREOF

(71) Applicant: PLAYNITRIDE INC., Tainan (TW)

(72) Inventors: Pei-Hsin Chen, Tainan (TW); Yi-Chun Shih, Tainan (TW); Yi-Ching Chen, Tainan (TW)

(73) Assignee: PLAYNITRIDE INC., Tainan (TW)

( * ) Notice: Subject to any disclaimer, the term of this patent is extended or adjusted under 35 U.S.C. 154(b) by 0 days.

(21) Appl. No.: 16/368,579

(22) Filed: Mar. 28, 2019

(65) Prior Publication Data

US 2019/0304958 A1  Oct. 3, 2019

(30) Foreign Application Priority Data

Mar. 28, 2018 (TW) .............................. 107110659 A (51) Int. Cl.
| | |
|---|---|
| *G06F 3/041* | (2006.01) |
| *H01L 25/075* | (2006.01) |
| *H01L 33/44* | (2010.01) |
| *H01L 33/62* | (2010.01) |
| *H01L 33/54* | (2010.01) |
| *G09G 3/32* | (2016.01) |

(52) U.S. Cl.
CPC ........ *H01L 25/0753* (2013.01); *G06F 3/0412* (2013.01); *G09G 3/32* (2013.01); *H01L 33/44* (2013.01); *H01L 33/54* (2013.01); *H01L 33/62* (2013.01); *H01L 2933/005* (2013.01); *H01L 2933/0025* (2013.01); *H01L 2933/0033* (2013.01)

(58) Field of Classification Search
CPC ........ G09G 3/32; G09G 3/3233; G09G 3/325; G06F 3/041; G06F 3/0412; G06F 3/0416
See application file for complete search history.

(56) References Cited

U.S. PATENT DOCUMENTS

| | | | |
|---|---|---|---|
| 9,748,291 B2* | 8/2017 | Ikeda | H01L 27/1225 |
| 9,991,163 B2* | 6/2018 | Bower | G09F 9/33 |
| 10,438,975 B1* | 10/2019 | Yueh | H01L 21/30604 |
| 2016/0093652 A1 | 3/2016 | Ikeda et al. | |
| 2019/0198732 A1* | 6/2019 | Shimizu | F21S 41/141 |
| 2019/0288007 A1* | 9/2019 | Yueh | H01L 21/30604 |

FOREIGN PATENT DOCUMENTS

| | | |
|---|---|---|
| TW | 201303832 A | 1/2013 |
| TW | 201614823 A | 4/2016 |

\* cited by examiner

*Primary Examiner* — Vijay Shankar
(74) *Attorney, Agent, or Firm* — Maschoff Brennan (57) ABSTRACT

A micro LED display panel comprises a substrate, a plurality of light emitting components, an insulating layer and a plurality of electrical components. The substrate comprises a first surface. The light emitting components are disposed on the first surface. The insulating layer is on the plurality of light emitting components and has a second surface and a third surface opposite to each other. The second surface faces the first surface. The electrical components are disposed on the third surface and electrically connect to the light emitting components. The number of the electrical components is less than the number of the light emitting components. The roughness of the third surface is greater than the roughness of the first surface.

14 Claims, 6 Drawing Sheets

MICRO LED DISPLAY PANEL AND MANUFACTURING METHOD THEREOF

CROSS-REFERENCE TO RELATED APPLICATIONS

This non-provisional application claims priority under 35 U.S.C. § 119(a) on Patent Application No(s). 107110659 filed in Taiwan on Mar. 28, 2018, the entire contents of which are hereby incorporated by reference.

TECHNICAL FIELD

This disclosure relates to an LED display panel and manufacturing method thereof, particularly an LED display method with multilayer structure and manufacturing method thereof.

RELATED ART

With the evolution of science and technology, displays have undergone one after another generation under the painstaking efforts of the researchers. From CRT (Cathode Ray Tube), LCD (Liquid-Crystal Display), PDP (Plasma Display panel) to the current popular OLED (Organic Light-Emitting Diodes) display, the display as an important part of the human-machine interface is facing another important evolution.

The size and the resolution of the display panel have been gradually enlarged and improved during the evolution process, while the components used by the display panel have been gradually miniaturized in order to bring the maximum performance of the display panel. In the past, the control circuit component or the control chip of the display panel is usually disposed in a non-active area, which is the surrounding of the active area (AA), to facilitate the layout of the wirings. However, such arrangement makes the border of the display panel unable to be further reduced, causing troubles to some applications (such as display splice or mechanical aesthetic design) of the display panel. On the other hand, the control circuit is also easier to be affected by the change of physical conditions when the components are miniaturized. For example, the control circuit may be more prone to generate the leakage current due to temperature or even illumination of light. These are questions that developers have to put into considerations.

SUMMARY

The present disclosure provides an LED display panel and its manufacturing method to reduce the border of the display panel and to prevent the control circuit of the display panel from the affection of the physical conditions.

According to one or more embodiments of this disclosure, a micro LED display panel comprises a substrate, a plurality of light emitting components, an insulating layer and a plurality of electrical components. The substrate comprises a first surface. The plurality of light emitting components are disposed on the first surface. The insulating layer is on the plurality of light emitting components and has a second surface and a third surface opposite to each other. The second surface faces the first surface. The plurality of electrical components are disposed on the third surface and electrically connects to the plurality of light emitting components. The number of the electrical components is less than the number of the light emitting components. The roughness of the third surface is greater than the roughness of the first surface.

According to one or more embodiments of this disclosure, a method for manufacturing micro LED display panel comprising: providing a substrate with a first surface; disposing a plurality of light emitting components on the first surface of the substrate; disposing an insulating layer on the plurality of light emitting components, wherein the insulating layer comprises a second surface and a third surface opposite to each other, the second surface faces the first surface, the third surface is away from the plurality of light emitting components, and the roughness of the third surface is greater than the roughness of the first surface; and disposing a plurality of first electrical components on the third surface and electrically connecting the plurality of first electrical components to the plurality of light emitting components, wherein the number of the first electrical components is less than the number of the light emitting components.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
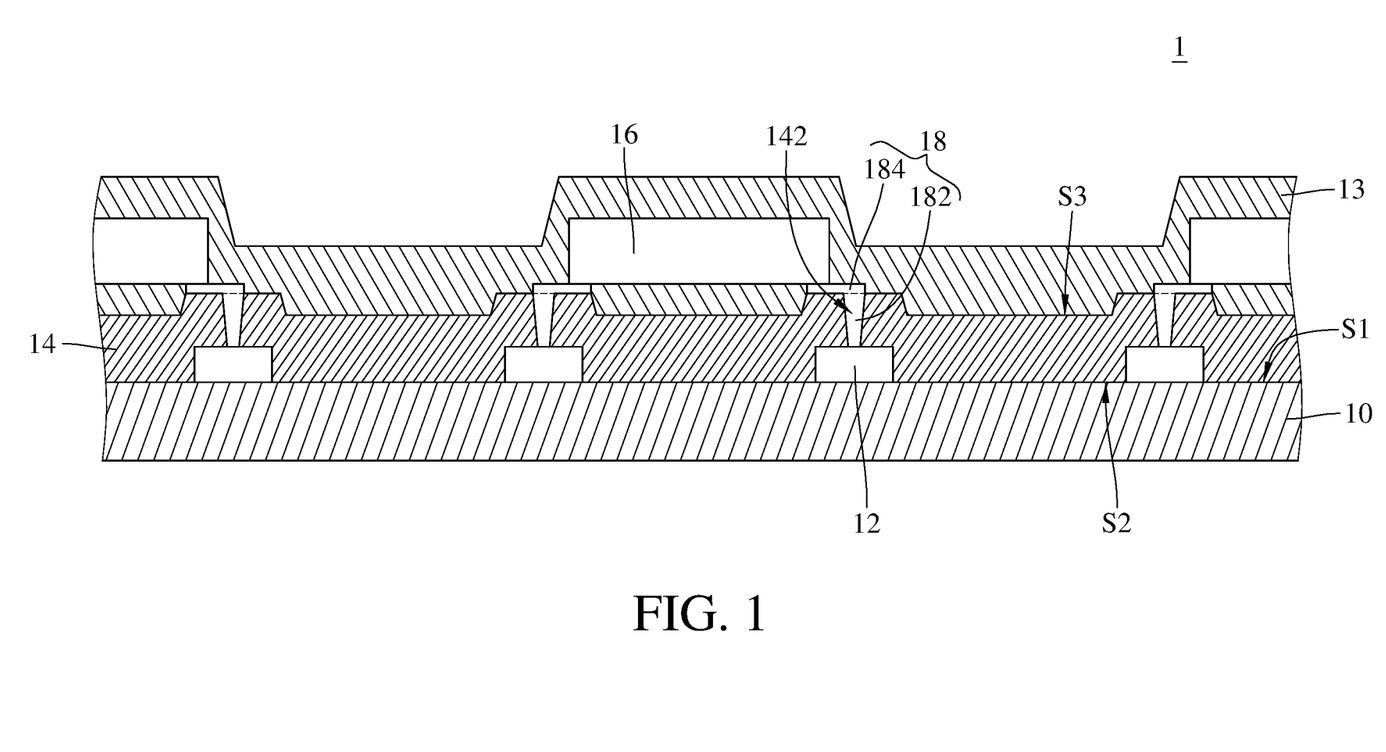
FIG. 1 is a schematic view of a profile of an LED display panel according to the first embodiment of the present disclosure.

Please refer to FIG. 1, which is a schematic view of a profile of an LED display panel according to an embodiment of the present disclosure. As shown in FIG. 1, the LED display panel 1 comprises a substrate 10, a plurality of light emitting components 12, an insulating layer 14 and a plurality of first electrical components 16.

The substrate 10 has a first surface S1, and the substrate 10 is a light transmissible substrate, such as a glass substrate or a sapphire substrate, so the light provided by the light emitting components 12 can transmit from one side of the substrate 10 to show the image. The light emitting components 12 are disposed on the first surface S1 of the substrate 10. Practically, the light emitting components 12 is such as an LED (Light Emitting Diode) or a micro LED. In an example where the light emitting components 12 is a micro LED, the light emitting components 12 has semiconductor layers respectively corresponding to P-type doping and N-type doping, and has a light emitting material layer between the two semiconductor layers, and each of the light emitting components 12 further comprises a plurality of electrodes (not depicted). The electrodes of the light emitting components 12, for example, are configured to provide a path to the P-type doped semiconductor layer or the N-type doped semiconductor layer for a signal conduction. That is to say, the light emitting components 12 may have two electrodes to respectively correspond to semiconductor layers of different doping types. In the direction shown in FIG. 1, the two electrodes may be respectively located on the upper surface and the lower surface of the light emitting components 12 (for example, a vertical type micro LED). Alternatively, the two electrodes may be both located on the upper surface or the lower surface of the light emitting components 12 (for example, a horizontal/flip type micro LED). Here, in the following embodiment, the two electrodes of the light emitting components 12 are on the same side, that is, on the side facing the electrical components 16.

In this embodiment, the light emitting components 12 and the first surface S1 of the substrate 10 are covered with the insulating layer 14. The insulating layer 14 has a second surface S2 and a third surface S3 opposite to each other, and the second surface S2 faces the first surface S1. In this embodiment, the insulating layer 14 comprises a plurality of through-holes 142 corresponding to the light emitting components 12. The plurality of through-holes 142 exposes electrodes of the light emitting components 12. The insulating layer 14 is of an insulating material, and is preferable to absorb or reflect the incident light from the light emitting components 12 to the insulating layer 14. In this embodiment, the insulating layer 14 covering the light emitting components 12 and the substrate 10 is in the form of a film layer, thus the insulating layer 14 is also disposed between the light emitting components 12. Therefore, the arrangement of the insulating layer 14 on the substrate 10 may be reduce, in some extent, a mutual interference between the light emitted from the adjacent light emitting components 12, and improve the contrast of the image provided by the LED display panel 1 accordingly. The light emitted by the light emitting components 12 is, for example, provided to the outside through the substrate 10. The insulating layer 14 is of a material such as black photoresist, opaque adhesive material, multilayer chromium film or resin.

The first electrical components 16 are disposed on the third surface S3 of the insulating layer 14 and electrically connect to the corresponding light emitting components 12. Specifically, in this embodiment, the LED display panel 1 further comprises conductive portions 18 disposed on the third surface S3 of the insulating layer 14 and filled in the through-holes 142, and the first electrical components 16 electrically connect to the electrodes of the light emitting components 12 by electrically connecting to the conductive portions 18. In practice, the part of the conductive portion 18 inside the through-hole 142 can be disposed along the wall of through-hole 142, or fill the accommodating space defined by the through-hole 142. The first electrical components 16 provide electric signals (such as driving currents) to the light emitting component 12 via the conductive portion 18. In practice, the first electrical component 16 may be a driver chip (e.g. driving IC) with a plurality of pins connected to multiple light emitting components 12, with each pin corresponding to one of the light emitting components 12 to control the luminous brightness of light emitting component 12. The material of the conductive portion 18 is a good conductor such as gold, silver or copper. In addition, regarding the first electrical component 16 electrically connects to the plurality of light emitting components 12, the present disclosure does not limit whether the plurality of light emitting components 12 electrically connected to the first electrical components 16 serves to emit light in the same color or to be controlled by the same pixel unit. The conductive portion 18, for example, further comprises a connective portion 182 and an extensive wiring portion 184. The connective portion 182 electrically connects to the extensive wiring portion 184. The connective portion 182 is in a respective one of the through-holes 142. The extensive wiring portion 184 is on the third surface S3. The first electrical components 16 corresponding to the conductive portion 18 is in contact with the extensive wiring portion 184 for electrically connecting to the conductive portion 18. The first electrical components 16 can be disposed appropriately on the third surface S3 without concerning the position of the light emitting component 12 if the extensive wiring portion 184 is arranged appropriately. On the other hand, because the position where the first electrical components 16 is in contact with the extensive wiring portion 184 is on the third surface S3, when bonding the first electrical components 16 to the extensive wiring portion 184, the insulating layer 14 bears most of the pressure so that the pressure does not act onto the light emitting components 12 directly, and it prevents the light emitting components 12 from damage due to the pressure.

In this embodiment, the roughness of the third surface S3 is greater than the roughness of the first surface S1. The roughness can be defined, for example, as the maximum value among a plurality of height differences in the area of one pixel.

More specifically, the insulating layer 14 is disposed on the first surface S1 and the light emitting components 12 by the manner such as coating, so the third surface S3 of the insulating layer 14 may have corresponding topographical features relief due to the lower layer structure such as the position, the thickness, and the shape of light emitting components 12. As a result, compared to the first surface S1, the third surface S3 is a plane with less smooth and poor flatness. In an embodiment, the number of light emitting components 12 is more than three times the number of first electrical components 16. Practically, the first electrical components 16 is usually configured to control multiple light emitting components 12. Therefore, the disposed density of the light emitting components 12 is greater than the disposed density of the first electrical components 16 in terms of the unit area of the first surface S1 of one substrate 10. On the other hand, the thickness of the first electrical components 16 is greater than the thickness of every light emitting component 12. That is to say, the first electrical components 16 is a relatively large component compared to the light emitting components 12. From another point of view, although the light emitting components 12 may cause the third surface S3 to be rough, due to a large number of the light emitting components 12, the surface relief is quite dense and uniform since the LEDs are distributed evenly in this embodiment. As set forth above, compared to the light emitting components 12, the first electrical components 16 is usually bigger, the extent of the surface relief of the third surface S3 has a relatively small influence to the first electrical components 16. As a result, in the design of structure stack, disposing the first electrical components 16 on the relatively rough third surface S3 and disposing the light emitting components 12 on the relatively flat first surface S1 can improve the yield rate of the process. In addition, in this embodiment, the insulating layer 14 can reflect and absorb the light emitted by the light emitting components 12, thereby reducing problems such as leakage current caused when the first electrical components 16 receive the light.

In the past, the first electrical components are usually disposed in the surrounding areas outside the display area of the LED display panel to constitute a border width. By disposing the first electrical components 16 on the insulating layer 14, the LED display panel 1 can no longer need these surrounding areas to accommodate the first electrical components 16, thus reducing the border width of the LED display panel 1, even a rimless LED display panel 1 can be implemented. The borderless LED display panel 1 can be used to splice into the desired size, which is quite flexible in application.

In the embodiment shown in FIG. 1, the LED display panel 1 further comprises a coating layer 13. The first electrical components 16 and the insulating layer 14 are covered with the coating layer 13. Practically, the coating layer 13 may be coated with an organic material or an inorganic material to protect the first electrical components 16 and related components from moisture.

Figure 2:
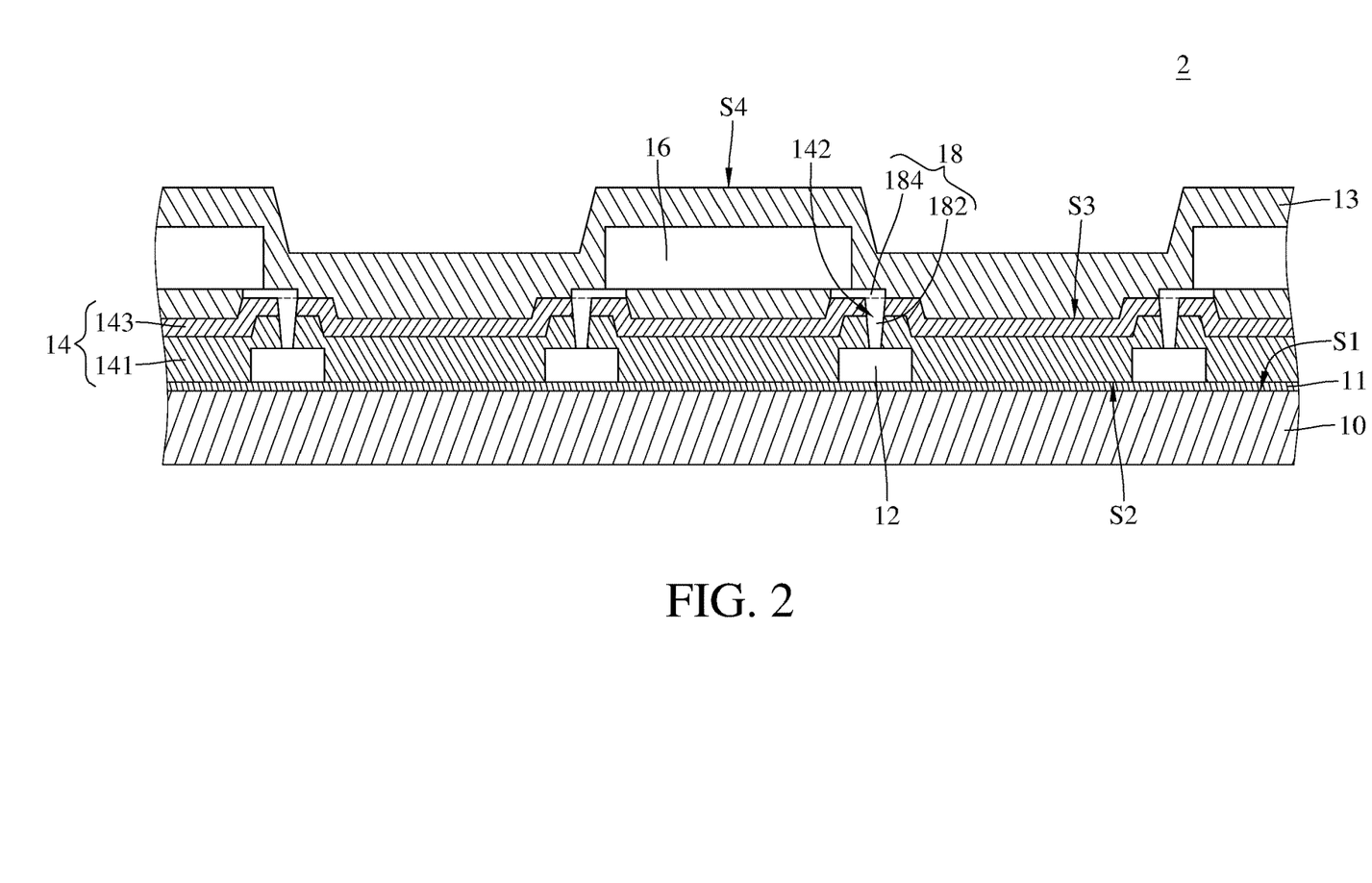
FIG. 2 is a schematic view of a profile of an LED display panel according to the second embodiment of the present disclosure.

Please refer to FIG. 2, which is a schematic view of a profile of the LED display panel according to the second embodiment of the present disclosure. In the second embodiment, the LED display panel 2 is similar to the LED display panel 1 shown in FIG. 1, the major difference is the adhesive layer 11 and the insulating layer 14 with a plurality of sub-layers. In the second embodiment, the adhesive layer 11 is laid on the entire first surface S1 of the substrate 10, so that the light emitting components 12 can be fixed on the first surface S1. In other embodiment, the adhesive layer 11 can be patterned and partially disposed on the first surface S1 corresponding to the positions of the light emitting components 12 instead of being entirely disposed on the first surface S1 of the substrate 10. In other words, the adhesive layer 11 is substantially only between the light emitting components 12 and the substrate 10 except for the overflow portion that has been squeezed. The adhesive layer 11 is constituted by, for example, an optically clear adhesive. The insulating layer 14 can further comprise the first insulating sub-layer 141 and the second insulating sub-layer 143. The first insulating sub-layer 141 may be a light-absorbing organic material, such as a black photoresist. The second insulating sub-layer 143 may be an inorganic insulating layer and serve as an intermediate medium to improve the adhesive capacity between the first insulating sub-layer 141 and others (such as the conductive portion 18 and the coating layer 3).

Figure 3:
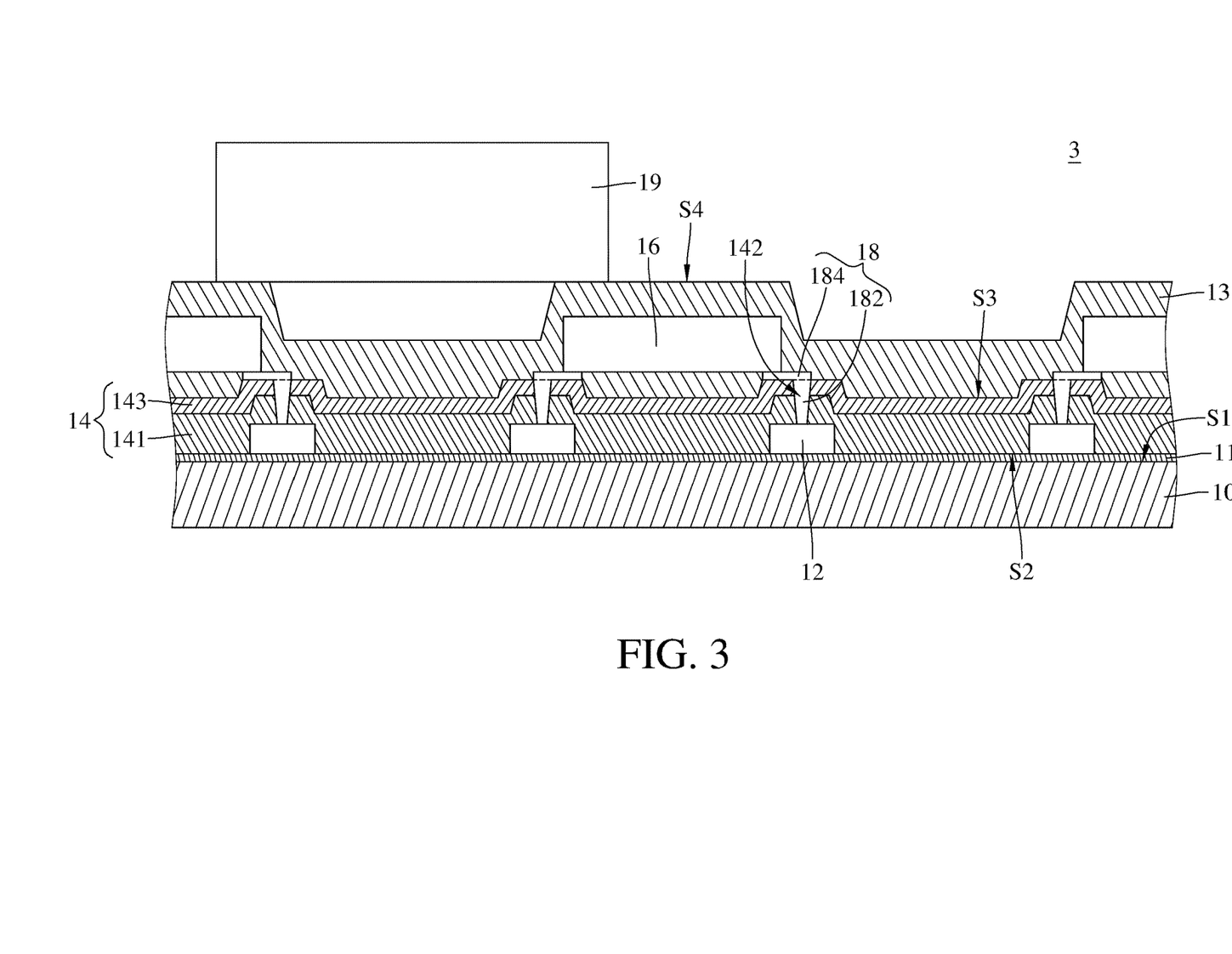
FIG. 3 is a schematic view of a profile of an LED display panel according to the third embodiment of the present disclosure.

Please refer to FIG. 3, which is a schematic view of a profile of an LED display panel according to the third embodiment of the present disclosure. In FIG. 3, the structure of the LED display panel 3 is substantially similar to the structure of the LED display panel 2 shown in FIG. 2. One of the differences is that the LED display panel 3 further comprises a second electrical component 19. The second electrical component 19 is disposed on the fourth surface S4 of the coating layer 13, and the roughness of the fourth surface S4 is greater than the roughness of the third surface S3 or than the roughness of the second surface S2. Moreover, the coating layer 13 is also an insulating layer and is disposed between the first electrical components 16 and the second electrical component 19. The second electrical component 19 is, for example, a chip (for example, integrated circuit chip) having a different function from the first electrical components 16. In this embodiment, the first electrical components 16 is, for example, a driver chip (including a gate driver circuit or a source driver circuit), the second electrical component 19 is a control chip (such as timing controller or TCON in brief), wherein the second electrical component 19 has a relatively complicated and relative large-scale circuit for processing complex computations. The overall size of the second electrical component 19 is greater than the overall size of the first electrical components 16. Practically, the number of the second electrical components 19 is less than the number of the first electrical components 16. Therefore, when the material is disposed on the second electrical component 19 to form a plane, said plane may be rougher than the aforementioned first surface S1, the second surface S2, and the third surface S3. As a result, based on the foregoing principle, the second electrical component 19 larger than the first electrical components 16 is disposed above the first electrical components 16, that is, the fourth surface S4.

Figure 4:
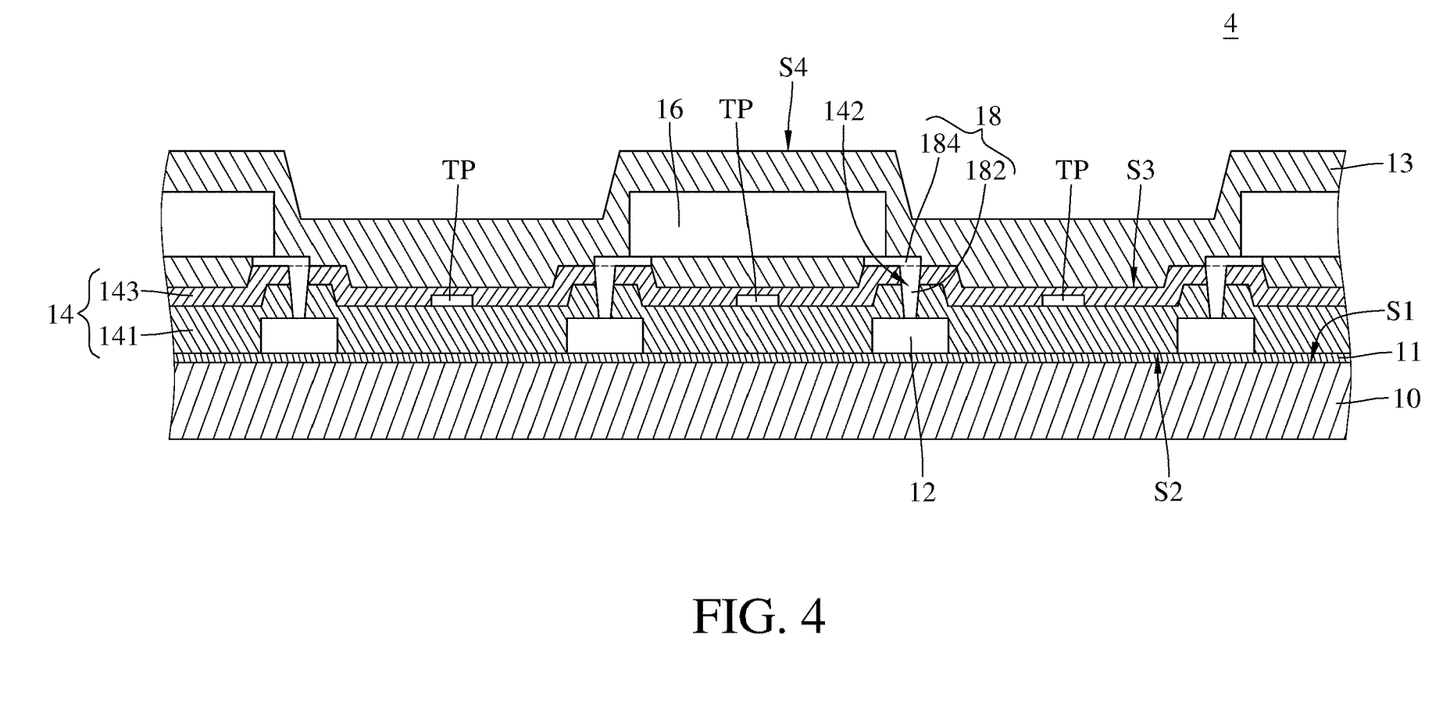
FIG. 4 is a schematic view of a profile of an LED display panel according to the fourth embodiment of the present disclosure.

Please refer to FIG. 4, which is a schematic view of a profile of an LED display panel according to the fourth embodiment of the present disclosure. In FIG. 4, the structure of the LED display panel 4 is substantially similar to the structure of the LED display panel 2 shown in FIG. 2. The details of similar components will not be described here, except for the LED display panel 4 further comprises a touch-sensing circuit TP. In the fourth embodiment, the touch-sensing circuit TP is in the insulating layer 14. Specifically, the insulating layer 14 comprises the first insulating sub-layer 141 and the second insulating sub-layer 143 as described above, and the touch-sensing circuit TP is between the first insulating sub-layer 141 and the second insulating sub-layer 143. In other words, the touch-sensing circuit TP is disposed between the light emitting components 12 and the first electrical components 16. Practically, the touch-sensing circuit TP is thin, not thicker than the light emitting components 12 and not thicker than the first electrical components 16. Therefore, in this embodiment, it is equivalent for the LED display panel 4 to utilize its original space to increases a touch-sensing function without additional volume after disposing the touch-sensing circuit TP.

Figure 5:
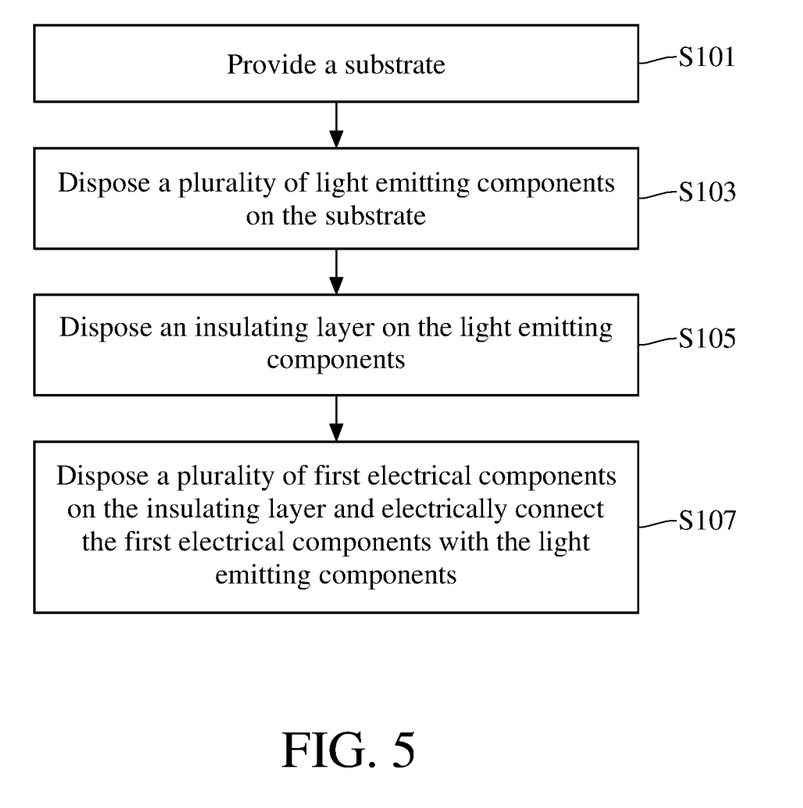
FIG. 5 is a flowchart of a method for manufacturing an LED display panel according to the first embodiment of the present disclosure.

FIG. 5 is a flowchart of a method for manufacturing an LED display panel (such as the LED display panel 1 in FIG. 1) according to the first embodiment of the present disclosure. Please refer to both FIG. 1 and FIG. 5. In step S101, provide a substrate 10 with a first surface S1. In step S103, dispose a plurality of light emitting components 12 on the first surface S1 of the substrate 10. In step S105, dispose an insulating layer 14 on the light emitting components 12 and the substrate 10, wherein the insulating layer 14 comprises a second surface S2 and a third surface S3 opposite to each other, the second surface S2 faces the first surface S1. Moreover, the roughness of third surface S3 of the insulating layer 14 is greater than the roughness of the first surface S1 of the substrate 10. In step S107, dispose a plurality of first electrical components 16 on the third surface S3 of the insulating layer 14. The plurality of first electrical components 16 electrically connect to the corresponding light emitting components 12 respectively and the number of the first electrical components 16 is less than the number of the light emitting components 12.

According to the flowchart of the present disclosure, in the disposing order of the structure of the LED display panel, a large number of small-sized light emitting components are preferably disposed on the surface of the substrate with the best flatness, then a small number of large-sized electrical components are stacked.

Since both the light emitting components and the electrical components need to be precisely positioned and bonded onto the substrate 10 and the flatness of the bonding surface has a close relationship with the bonding yield, the large number of small-sized light emitting components must have the finest alignment process technology. As a result, LED display panels with higher yield rate and better display quality can be obtained by the structure and the processing order of the present disclosure.

Figure 6:
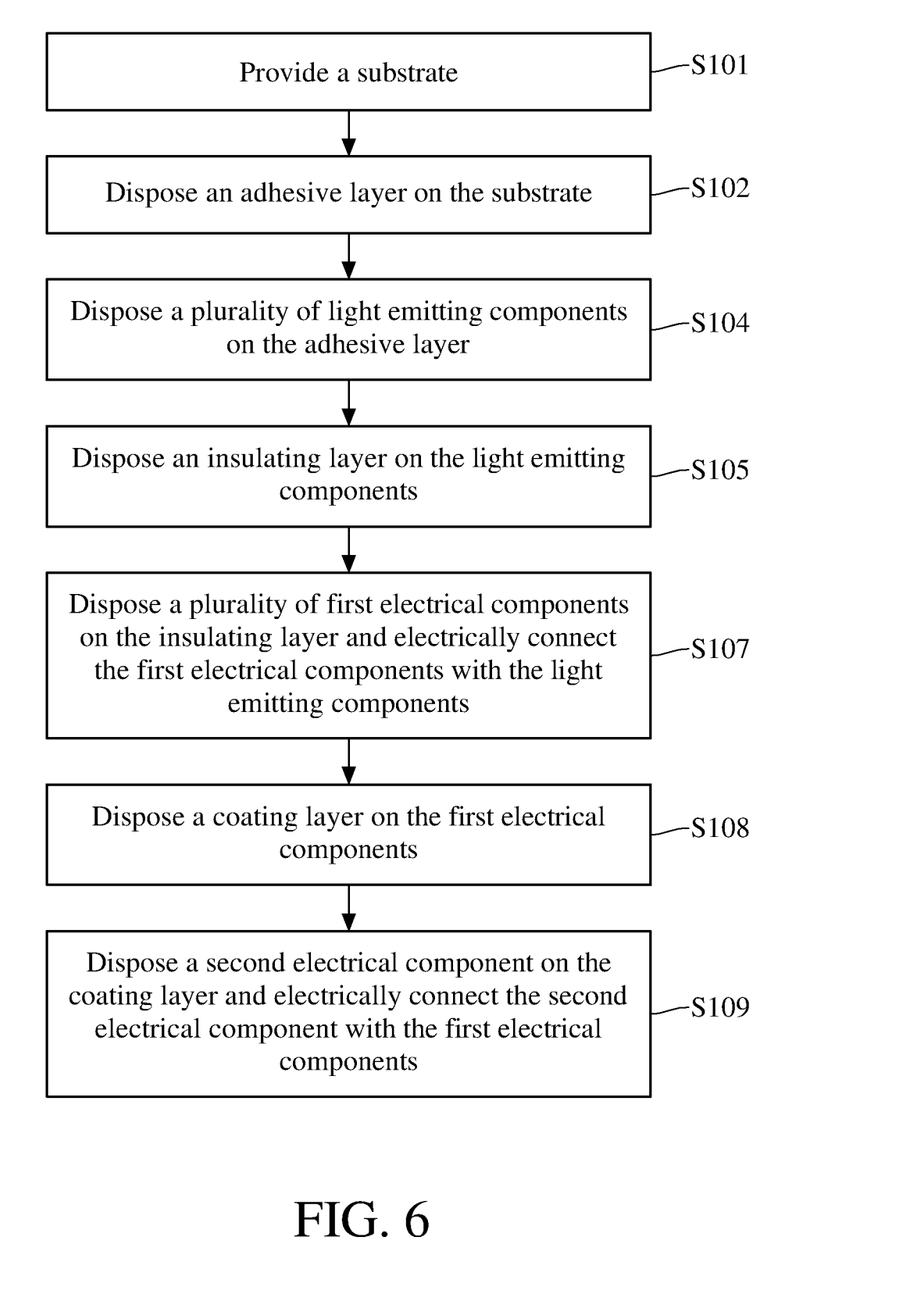
FIG. 6 is a flowchart of a method for manufacturing an LED display panel according to the second embodiment of the present disclosure.

FIG. 6 is a flowchart of a method for manufacturing an LED display panel (such as the LED display panel 4 in FIG. 4). according to the fourth embodiment of the present disclosure. Please refer to both FIG. 4 and FIG. 6. In step S101, provide a substrate 10 with a first surface S1. In step S102, dispose an adhesive layer 11 on the first surface S1 of the substrate 10. In step S104, dispose a plurality of light emitting components 12 on the adhesive layer 11 for fixing the plurality of light emitting components 12 on the adhesive layer 11 and fixing on the substrate 10 by the adhesive layer 11. In step S105, dispose an insulating layer 14 on the light emitting components 12, wherein the insulating layer 14 comprises a second surface S2 and a third surface S3 opposite to each other, the second surface S2 faces the first surface S1. Moreover, the roughness of the third surface S3 of the insulating layer 14 is greater than the roughness of the first surface S1 of the substrate 10. In step S107, dispose a plurality of first electrical components 16 on the third surface S3 of the insulating layer 14. The plurality of first electrical components 16 electrically connect to the corresponding light emitting components 12 respectively and the number of the first electrical components 16 is less than the number of the light emitting components 12. In step S108, dispose a coating layer 13 on the plurality of first electrical components 16, wherein the coating layer 13 comprises a fourth surface S4 away from the third surface S3, the roughness of the fourth surface S4 is greater than the roughness of the third surface S3. In step S109, dispose a second electrical component 19 on the coating layer 13 and electrically connect the second electrical component 19 to the first electrical components 16.

On the other hand, in step S105, the insulating layer 14 comprises the first insulating sub-layer 141 and second insulating sub-layer 143 as the fourth embodiment shown in FIG. 4, and a touch-sensing circuit TP is disposed between the first insulating sub-layer 141 and the second insulating sub-layer 143. In other words, firstly, the light emitting components 12 is covered with the first insulating sub-layer 141, then the touch-sensing circuit TP is disposed, then the second insulating sub-layer 143 is deposited.

To sum up, the present disclosure provides the LED display panel and the manufacturing method thereof, so that the driver chips may locate in the active area. In addition, the driver chips are isolated from the light emitting components by the insulating layer, so that the driver chips do not generate a leakage current due to the affection of the light emitted from the light emitting components. Therefore, the LED display panel and the manufacturing method provided by the present disclosure can reduce the border width of the display panel, even the target of a rimless display panel can be achieved. On the other hand, under the protection of the insulating layer, the driver chips are not affected by physical conditions except that the driver chips are not exposed to the light.

What is claimed is:

1. A method for manufacturing micro LED display panel, comprising:
    providing a substrate with a first surface;
    disposing a plurality of light emitting components on the first surface of the substrate;
    disposing an insulating layer on the plurality of light emitting components, wherein the insulating layer comprises a second surface and a third surface opposite to each other, the second surface faces the first surface, the third surface is away from the plurality of light emitting components, and a roughness of the third surface is greater than a roughness of the first surface; and
    disposing a plurality of first electrical components on the third surface and electrically connecting the plurality of first electrical components to the plurality of light emitting components, wherein a number of the first electrical components is less than a number of the light emitting components.

2. The method for manufacturing micro LED display panel according to claim 1, wherein disposing the plurality of light emitting components on the first surface of the substrate further comprises:
    disposing an adhesive layer on the first surface of the substrate; and
    disposing the plurality of light emitting components on the adhesive layer for fixing the plurality of light emitting components on the adhesive layer.

3. The method for manufacturing micro LED display panel according to claim 1, further comprising:
    disposing a coating layer on the plurality of first electrical components and the insulating layer, wherein the coating layer comprises a fourth surface away from the third surface, and a roughness of the fourth surface is greater than the roughness of the third surface; and
    disposing a second electrical component on the fourth surface, wherein a size of the second electrical component is larger than a size of any one of the first electrical components.

4. The method for manufacturing micro LED display panel according to claim 3, wherein a thickness of the second electrical component is larger than a thickness of any one of the first electrical components, and a thicknesses of the plurality of the first electrical components are larger than a thicknesses of the plurality of the light emitting components.

5. The method for manufacturing micro LED display panel according to claim 1, wherein the insulating layer comprises a first insulating sub-layer and a second insulating sub-layer, and disposing the insulating layer on the plurality of light emitting components further comprises:
    disposing the first insulating sub-layer on the plurality of light emitting components and the substrate, wherein the second surface is a surface of the first insulating sub-layer facing the first surface;
    disposing a touch-sensing circuit on the first insulating sub-layer; and
    disposing the second insulating sub-layer on the touch-sensing circuit and the first insulating sub-layer, wherein the third surface is a surface of the second surface away from the first surface.

6. The method for manufacturing micro LED display panel according to claim 1, wherein a thicknesses of the plurality of first electrical components is large than a thicknesses of the plurality of light emitting components.

7. A micro LED display panel comprising:
a substrate with a first surface;
a plurality of light emitting components disposed on the first surface;
an insulating layer on the plurality of light emitting components and having a second surface and a third surface opposite to each other, the second surface facing the first surface; and
a plurality of electrical components disposed on the third surface and electrically connected to the plurality of light emitting components, wherein a number of the electrical components is less than a number of the light emitting components;
wherein a roughness of the third surface is greater than a roughness of the first surface.

8. The micro LED display panel according to claim 7, wherein the plurality of electrical components are driver chips for driving the plurality of light emitting components.

9. The micro LED display panel according to claim 8, wherein the number of the plurality of light emitting components is more than three times the number of the driver chips.

10. The micro LED display panel according to claim 7, wherein a thickness of each of the light emitting components is smaller than a thicknesses of the plurality of electrical components.

11. The micro LED display panel according to claim 7, further comprising an adhesive layer disposed on the first surface and between the plurality of light emitting components and the substrate, wherein the plurality of light emitting components fix on the adhesive layer.

12. The micro LED display panel according to claim 7, wherein the insulating layer is of black photoresist.

13. The micro LED display panel according to claim 7, wherein a step-height of the first surface is smaller than a step-height of the third surface.

14. The micro LED display panel according to claim 7, further comprising a touch-sensing circuit, wherein the insulating layer comprises a first insulating sub-layer and a second insulating sub-layer, the second insulating sub-layer is on the first insulating sub-layer and the touch-sensing circuit is between the first insulating sub-layer and the second insulating sub-layer.

* * * * *